United States Patent
Kotoo et al.

(10) Patent No.: US 11,069,735 B2
(45) Date of Patent: Jul. 20, 2021

(54) SEMICONDUCTOR DEVICE AND IMAGING DEVICE

(71) Applicant: SONY CORPORATION, Tokyo (JP)

(72) Inventors: Kengo Kotoo, Kumamoto (JP); Kaoru Koike, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/917,397

(22) Filed: Jun. 30, 2020

(65) Prior Publication Data

US 2020/0335543 A1 Oct. 22, 2020

Related U.S. Application Data

(63) Continuation of application No. 16/439,235, filed on Jun. 12, 2019, now Pat. No. 10,720,462, which is a
(Continued)

(30) Foreign Application Priority Data

May 18, 2015 (JP) ................................ 2015-100742

(51) Int. Cl.
*H01L 27/146* (2006.01)
*H01L 25/18* (2006.01)
(Continued)

(52) U.S. Cl.
CPC ........ *H01L 27/14634* (2013.01); *G06F 30/39* (2020.01); *H01L 23/522* (2013.01);
(Continued)

(58) Field of Classification Search
CPC . H01L 2224/80895; H01L 2224/80896; H01L 2224/08145; H01L 25/0657;
(Continued)

(56) References Cited

U.S. PATENT DOCUMENTS

| 9,972,650 B2 * | 5/2018 | Kobayashi ........ H01L 27/14634 |
| 2003/0157748 A1 * | 8/2003 | Kim .................. H01L 21/76804 |
| | | 438/107 |

(Continued)

FOREIGN PATENT DOCUMENTS

| JP | H05-082404 A | 4/1993 |
| JP | 2010-103195 | 5/2010 |

(Continued)

OTHER PUBLICATIONS

Official Action (no English translation available) for Japanese Patent Application No. 2017-519095, dated Apr. 21, 2020, 10 pages.
(Continued)

*Primary Examiner* — Errol V Fernandes
*Assistant Examiner* — Jeremy J Joy
(74) *Attorney, Agent, or Firm* — Sheridan Ross P.C.

(57) ABSTRACT

To improve the joining strength between semiconductor chips. In a semiconductor device, a first semiconductor chip includes a first joining surface including a first insulating layer, a plurality of first pads to which a first inner layer circuit insulated by the first insulating layer is electrically connected, and a linear first metal layer arranged on an outside of the plurality of first pads. A second semiconductor chip includes a second joining surface joined to the first joining surface, the second joining surface including a second insulating layer, a plurality of second pads that are arranged in positions facing the first pads and to which a second inner layer circuit insulated by the second insulating layer is electrically connected, and a linear second metal layer arranged in a position facing the first metal layer. A width of the first metal layer and the second metal layer is a width based on a joining strength between the first insulating layer and the second insulating layer and a joining strength between the first metal layer and the second metal
(Continued)

layer in an area from an end portion of the first semiconductor chip to the first pad.

20 Claims, 10 Drawing Sheets

Related U.S. Application Data continuation of application No. 15/572,870, filed as application No. PCT/JP2016/063037 on Apr. 26, 2016, now Pat. No. 10,355,039.

(51) Int. Cl.
| | |
|---|---|
| *H01L 25/16* | (2006.01) |
| *H01L 25/075* | (2006.01) |
| *H01L 25/07* | (2006.01) |
| *H01L 25/065* | (2006.01) |
| *H01L 25/04* | (2014.01) |
| *H01L 23/58* | (2006.01) |
| *H01L 23/532* | (2006.01) |
| *H01L 23/528* | (2006.01) |
| *H01L 23/522* | (2006.01) |
| *H01L 23/00* | (2006.01) |
| *G06F 30/39* | (2020.01) |

(52) U.S. Cl.
CPC .......... *H01L 23/562* (2013.01); *H01L 23/585* (2013.01); *H01L 24/08* (2013.01); *H01L 24/89* (2013.01); *H01L 25/043* (2013.01); *H01L 25/065* (2013.01); *H01L 25/0657* (2013.01); *H01L 25/07* (2013.01); *H01L 25/074* (2013.01); *H01L 25/0756* (2013.01); *H01L 25/16* (2013.01); *H01L 25/18* (2013.01); *H01L 27/1469* (2013.01); *H01L 27/14636* (2013.01); *H01L 23/528* (2013.01); *H01L 23/5226* (2013.01); *H01L 23/53228* (2013.01); *H01L 27/14621* (2013.01); *H01L 27/14627* (2013.01); *H01L 2224/08121* (2013.01); *H01L 2224/08145* (2013.01); *H01L 2224/80121* (2013.01); *H01L 2224/80194* (2013.01); *H01L 2224/80895* (2013.01); *H01L 2224/80896* (2013.01)

(58) Field of Classification Search
CPC . H01L 25/0756; H01L 25/043; H01L 25/074; H01L 25/16; H01L 25/18; H01L 27/14634; H01L 27/14636; H01L 27/1469; H01L 23/522; H01L 23/562; H01L 23/585; H01L 23/53228; H01L 24/08; H01L 24/89
See application file for complete search history.

(56) References Cited

U.S. PATENT DOCUMENTS

| | | | | |
|---|---|---|---|---|
| 2006/0003548 | A1* | 1/2006 | Kobrinsky | H01L 21/76885 438/455 |
| 2011/0101537 | A1* | 5/2011 | Barth | H01L 24/80 257/774 |
| 2013/0284885 | A1* | 10/2013 | Chen | H01L 27/1469 250/208.1 |
| 2014/0145338 | A1* | 5/2014 | Fujii | H01L 23/49866 257/762 |
| 2015/0137357 | A1* | 5/2015 | Kikuchi | H01L 23/49838 257/737 |
| 2015/0155323 | A1* | 6/2015 | Ahn | H01L 27/14687 257/184 |
| 2015/0279816 | A1* | 10/2015 | Chen | H01L 23/528 257/774 |
| 2017/0186734 | A1* | 6/2017 | Kim | H01L 25/0657 |

FOREIGN PATENT DOCUMENTS

| | | | |
|---|---|---|---|
| JP | 2011-054637 | | 3/2011 |
| JP | 2011054637 | A * | 3/2011 |
| JP | 2012-244101 | | 12/2012 |
| JP | 2012-256736 | | 12/2012 |
| JP | 2013-232646 | | 11/2013 |
| JP | 2015-099827 | | 5/2015 |

OTHER PUBLICATIONS

Official Action (no English translation available) for Japanese Patent Application No. 2017-519095, dated Jun. 23, 2020, 4 pages.

\* cited by examiner a b a b a b a b

SEMICONDUCTOR DEVICE AND IMAGING DEVICE

CROSS REFERENCE TO RELATED APPLICATIONS

This application is a continuation of U.S. patent application Ser. No. 16/439,235 filed Jun. 12, 2019, which is a continuation of U.S. patent application Ser. No. 15/572,870, filed Nov. 9, 2017, now U.S. Pat. No. 10,355,039, which is a national stage application under 35 U.S.C. 371 and claims the benefit of PCT Application No. PCT/JP2016/063037 having an international filing date of Apr. 26, 2016, which designated the United States, which PCT application claimed the benefit of Japanese Patent Application No. 2015-100742 filed May 18, 2015, the disclosures of which are incorporated herein by reference in their entirety.

TECHNICAL FIELD

The present technology relates to a semiconductor device and an imaging device. More specifically, the present technology relates to a semiconductor device and an imaging device formed by joining two semiconductor chips.

BACKGROUND ART

Thus far, a semiconductor device in which a plurality of semiconductor chips are stacked to form a three-dimensional configuration and thereby downsizing is achieved has been used. For example, in an imaging device, a light receiving element chip that is a semiconductor chip having a configuration in which pixels each including a light receiving element are arranged in a two-dimensional array configuration and a peripheral circuit chip formed of a peripheral circuit that drives the light receiving element chip are manufactured separately on the basis of the respective manufacturing processes. After that, a manufacturing method in which these chips are joined together and stacked and thereby the imaging device is configured is employed. In a case where such a manufacturing method is employed, it is desirable to enhance the joining strength at the joining surface in order to improve the reliability of the imaging device.

On the joining surface of these chips, pads electrically connected to a circuit in the semiconductor chip are arranged; and the transmission of electrical signals between the chips is enabled by these pads being joined together. These pads are configured with a metal such as copper (Cu), and therefore a relatively high joining strength can be obtained. On the other hand, an insulating layer for insulating the pads etc. is placed in regions other than the pads of the joining surface. The joining strength between these insulating layers is lower than the joining strength between the pads; hence, a system that activates the joining surface by plasma treatment to improve the joining strength is proposed (e.g., see Patent Literature 1).

CITATION LIST

Patent Literature

Patent Literature 1: JP H5-082404A

DISCLOSURE OF INVENTION

Technical Problem

The conventional technology described above has an effect of improving the joining strength between the insulating films of the joining surfaces by activation, but on the other hand has problems that the pad is damaged and degraded, and copper (Cu) configuring the pad flies about and the apparatus for joining the semiconductor chips is contaminated.

The present technology has been made in view of such circumstances, and an object of the present technology is to improve the joining strength between semiconductor chips without performing activation treatment of the joining surface.

Solution to Problem

The present technology is devised to solve the above-described problem, and a first aspect thereof is a semiconductor device including: a first semiconductor chip including a first joining surface including a first insulating layer, a plurality of first pads to which a first inner layer circuit insulated by the first insulating layer is electrically connected, and a linear first metal layer arranged on an outside of the plurality of first pads; and a second semiconductor chip including a second joining surface joined to the first joining surface, the second joining surface including a second insulating layer, a plurality of second pads that are arranged in positions facing the first pads and to which a second inner layer circuit insulated by the second insulating layer is electrically connected, and a linear second metal layer arranged in a position facing the first metal layer. A width of the first metal layer and the second metal layer is a width based on a joining strength between the first insulating layer and the second insulating layer and a joining strength between the first metal layer and the second metal layer in an area from an end portion of the first semiconductor chip to the first pad. This brings about an action in which the first metal layer and the second metal layer with a width based on the joining strength between the first insulating layer and the second insulating layer and the joining strength between the first metal layer and the second metal layer in an area extending from an end portion of the first semiconductor chip to the first pad are arranged.

Further, according to this first aspect, the width of the first metal layer and the second metal layer may be a width based on an average value of a joining strength between the first insulating layer and the second insulating layer and a joining strength between the first metal layer and the second metal layer in the area. This brings about an action in which the first metal layer and the second metal layer with a width based on the average value of the joining strength between the first insulating layer and the second insulating layer and the joining strength between the first metal layer and the second metal layer in the area are arranged.

Further, according to this first aspect, the width of the first metal layer and the second metal layer may be substantially equal to a width Q satisfying the following relation, $(x \times p + y \times Q)/R \geq z$ where z: a joining strength per unit area between the first semiconductor chip and the second semiconductor chip, x: a joining strength per unit area between the first insulating layer and the second insulating layer, y: a joining strength per unit area between the first metal layer and the second metal layer, P: a length of a joining portion of the first insulating layer and the second insulating layer on a path crossing an end portion of the first semiconductor chip substantially perpendicularly, and R: a length between the first pad and the end portion of the first semiconductor chip on the path. This brings about an action in which the first metal layer and the second metal layer with a width based on the length of a joining portion of the first insulating layer and the second insulating layer on a path crossing an end portion of the first semiconductor chip substantially perpendicularly and on other factors are arranged.

Further, according to this first aspect, the path may be a path crossing the end portion of the first semiconductor chip substantially perpendicularly, and extending from the end portion of the first semiconductor chip and first reaching the first pad. This brings about an action in which the first metal layer and the second metal layer with a width based on the length of a joining portion of the first insulating layer and the second insulating layer on the shortest path between an end portion of the first semiconductor chip and the first pad and on other factors are arranged.

Further, according to this first aspect, the path may be a path with the longest distance among paths crossing the end portion of the first semiconductor chip substantially perpendicularly, and extending from the end portion of the first semiconductor chip and first reaching the first pad. This brings about an action in which the first metal layer and the second metal layer with a width based on the length of a joining portion of the first insulating layer and the second insulating layer on a path with the smallest joining strength and on other factors are arranged.

Further, according to the first aspect, the first joining surface may further include a first dummy pad to which the first inner layer circuit is not electrically connected. The second joining surface may further include a second dummy pad that is arranged in a position facing the first dummy pad and to which the second interior circuit is not electrically connected. The width of the first metal layer and the second metal layer may be a width based on a joining strength between the first insulating layer and the second insulating layer and a joining strength between the first metal layer and the second metal layer in an area extending from an end portion of the first semiconductor chip and first reaching the first pad or the first dummy pad. This brings about an action in which the first metal layer and the second metal layer with a width based on the joining strength between the first insulating layer and the second insulating layer and the joining strength between the first metal layer and the second metal layer in an area extending from an end portion of the first semiconductor chip and first reaching the first pad or the first dummy pad are arranged.

Further, according to this first aspect, the first metal layer and the second metal layer may be divided into a prescribed number of pieces. This brings about an action in which the first metal layer and the second metal layer are divided.

Further, according to this first aspect, the first semiconductor chip and the second semiconductor chip may be configured in a rectangular shape. The width of the first metal layer and the second metal layer may be a width based on a joining strength between the first insulating layer and the second insulating layer and a joining strength between the first metal layer and the second metal layer in the area for each side of each of the first semiconductor chip and the second semiconductor chip. This brings about an action in which the first metal layer and the second metal layer with a width based on the joining strength between the first insulating layer and the second insulating layer and the joining strength between the first metal layer and the second metal layer in the area for each side of each of the semiconductor chips are arranged.

Further, a second aspect of the present technology is an imaging device including: a first semiconductor chip including a first joining surface including a first insulating layer, a plurality of first pads to which a first inner layer circuit insulated by the first insulating layer is electrically connected, and a linear first metal layer arranged on an outside of the plurality of first pads, and a first diffusion layer including a semiconductor region to which the first inner layer circuit is electrically connected and that convers applied light to an electrical signal; and a second semiconductor chip joined to the first joining surface, the second semiconductor chip including a second joining surface including a second insulating layer, a plurality of second pads that are arranged in positions facing the first pads and to which a second inner layer circuit insulated by the second insulating layer is electrically connected, and a linear second metal layer arranged in a position facing the first metal layer, and a second diffusion layer including a semiconductor region to which the second inner layer circuit is electrically connected and that processes the electrical signal. A width of the first metal layer and the second metal layer is a width based on a joining strength between the first insulating layer and the second insulating layer and a joining strength between the first metal layer and the second metal layer in an area extending from an end portion of the first semiconductor chip to the first pad. This brings about an action in which the first metal layer and the second metal layer with a width based on the joining strength between the first insulating layer and the second insulating layer and the joining strength between the first metal layer and the second metal layer in an area extending from an end portion of the first semiconductor chip to the first pad are arranged.

Advantageous Effects of Invention

According to the present technology, an excellent effect of improving the joining strength between semiconductor chips can be exhibited without performing activation treatment of the joining surface. Note that the effects described here are not necessarily limited, and any effect that is desired to be described in the present disclosure may be exhibited.

MODE(S) FOR CARRYING OUT THE INVENTION

Hereinbelow, embodiments for implementing the present technology (hereinafter, referred to as embodiments) are described. The description is given in the following order.
1. First embodiment (example of case where guard ring is used)
2. Second embodiment (example of case where guard ring is divided)
3. Third embodiment (example of case where dummy pad is used)

1. First Embodiment

[Configuration of Semiconductor Device]

Figure 1:
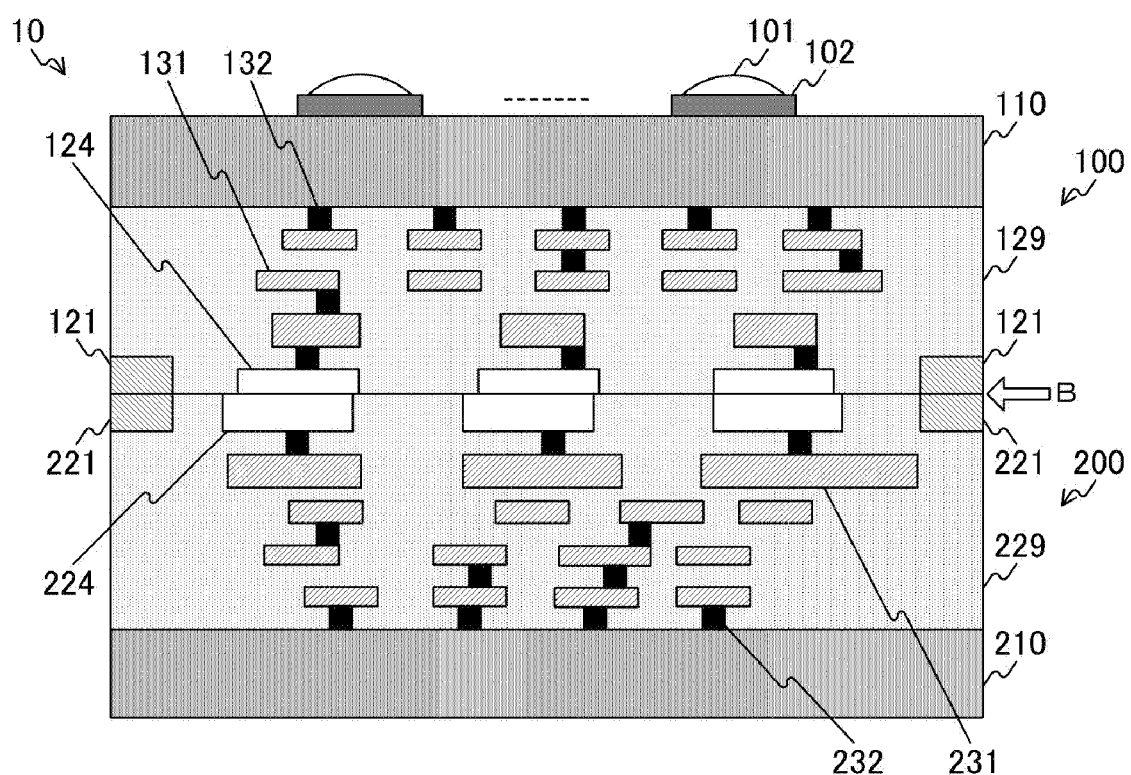
FIG. 1 is a diagram showing an example of the configuration of a semiconductor device 10 in a first embodiment of the present technology.

FIG. 1 is a diagram showing an example of the configuration of a semiconductor device 10 in a first embodiment of the present technology. The drawing is a cross-sectional view showing the configuration of an imaging device used for a camera or the like. The configuration of the semiconductor device 10 in an embodiment of the present technology will now be described using this imaging device as an example. The semiconductor device 10 includes a first semiconductor chip 100 and a second semiconductor chip 200. Further, the semiconductor device 10 is configured by the first semiconductor chip 100 and the second semiconductor chip 200 being joined together at the position of "B" written in the drawing. In addition, the semiconductor device 10 is an example of an imaging device described in the claims.

The first semiconductor chip 100 converts an image to an electrical signal. In the first semiconductor chip 100, pixels (not illustrated) that generate an electrical signal in accordance with the applied light are arranged in a two-dimensional array configuration. The electrical signal generated by these pixels is outputted to the second semiconductor chip 200. The first semiconductor chip 100 includes microlenses 101, color filters 102, a first diffusion layer 110, interconnection layers 131, vias 132, a first insulating layer 129, first pads 124, and a first guard ring 121.

The microlens 101 forms an optical image on the pixel described above. The color filter 102 is an optical filter for causing light of a desired wavelength to be incident on the pixel.

The first diffusion layer 110 is a semiconductor region where the pixel described above is created. The microlens 101 and the color filter 102 are arranged in each of the pixels.

The interconnection layer 131 transmits an electrical signal. The interconnection layer 131 is drawn to each of the plurality of pixels that are formed in the first diffusion layer 110 so as to be arranged in an XY matrix configuration. The supply of electric power, the input of a control signal, and the output of an electrical signal to/from the pixel are performed via the interconnection layer 131. The interconnection layer 131 may be stacked in a plurality of layers. The drawing shows an example of interconnection layers 131 stacked in three layers. The via 132 electrically connects interconnection layers 131 arranged in different layers. Copper (Cu) may be used for the interconnection layer 131 and the via 132, for example. In addition, the interconnection layer 131 and the via 132 configure a first inner layer circuit.

The first insulating layer 129 insulates the interconnection layer 131 and the via 132. The first insulating layer 129 is joined to a second insulating layer 229 described later. Silicon dioxide ($SiO_2$[0]) or organic silica glass may be used for the first insulating layer 129, for example.

The first pad 124 is electrically connected to the interconnection layer 131 and the via 132, and mutually transmits an electrical signal with the second semiconductor chip 200. As many first pads as a number in accordance with the signals to be transmitted may be arranged in the first semiconductor chip 100. Further, the first pad 124 is joined to a second pad 224 described later. Copper (Cu) may be used for the first pad 124, for example.

The first guard ring 121 is a linear metal layer arranged on the outside of the first pad. Further, the first guard ring 121 is joined to a second guard ring 221 described later. The first guard ring 121 may be electrically connected to the interconnection layer 131 and the via 132, and may be connected to, for example, a grounding conductor. Further, the first guard ring 121 may not be connected to the interconnection layer 131 or the via 132, and may be of an electrically independent configuration. Copper (Cu) may be used for the first guard ring 121, for example. In addition, the first guard ring 121 is an example of a first metal layer described in the claims.

The second semiconductor chip 200 is electrically and mechanically joined to the first semiconductor chip 100, and performs the generation of a control signal for the pixel of the first semiconductor chip 100, the processing of an electrical signal generated by the pixel, etc. Examples of this processing include analog/digital conversion that converts an analog electrical signal generated by the first semiconductor chip 100 to a digital electrical signal. The second semiconductor chip 200 includes a second diffusion layer 210, interconnection layers 231, vias 232, a second insulating layer 229, second pads 224, and a second guard ring 221.

The second diffusion layer 210 is a semiconductor region that performs the generation of a control signal, the processing of an electrical signal, etc. described above. The electrical signal processed by this semiconductor region is outputted as an image signal to the outside of the semiconductor device 10.

The interconnection layer 231 transmits an electrical signal. Similarly to the interconnection layer 131, the interconnection layer 231 may be stacked in a plurality of layers. The drawing shows an example of interconnection layers 231 stacked in four layers. The via 232 electrically connects interconnection layers 231 arranged in different layers. Copper (Cu) may be used for the interconnection layer 231 and the via 232, for example. In addition, the interconnection layer 231 and the via 232 configure a second inner layer circuit.

The second insulating layer 229 insulates the interconnection layer 231 and the via 232. As described above, the second insulating layer 229 is joined to the first insulating layer 129. Silicon dioxide ($SiO_2$[0]) or organic silica glass may be used for the second insulating layer 229, for example.

The second pad 224 is electrically connected to the interconnection layer 231 and the via 232, and mutually transmits an electrical signal with the first semiconductor chip 100. As described above, the second pad 224 is joined to the first pad 124. Copper (Cu) may be used for the first pad 224, for example.

The second guard ring 221 is a linear metal layer arranged on the outside of the second pad. As described above, the second guard ring 221 is joined to the first guard ring 121. Copper (Cu) may be used for the second guard ring 221, for example. In addition, the second guard ring 221 is an example of a second metal layer described in the claims.

[Configuration of Semiconductor Chip]

Figure 2:
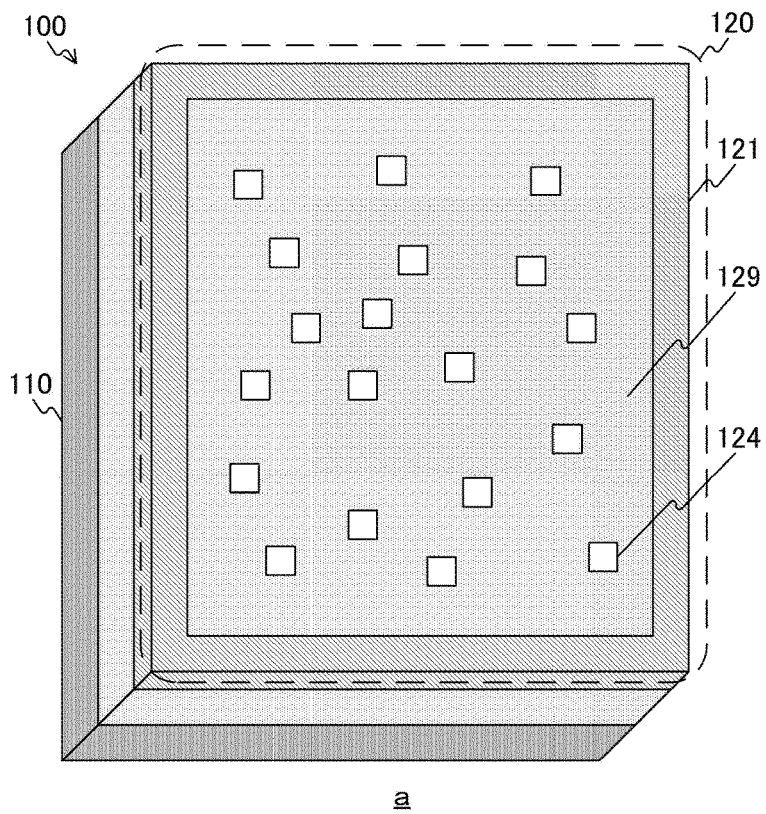
FIG. 2 is a diagram showing an example of the configuration of semiconductor chips in the first embodiment of the present technology.
Figure 2:
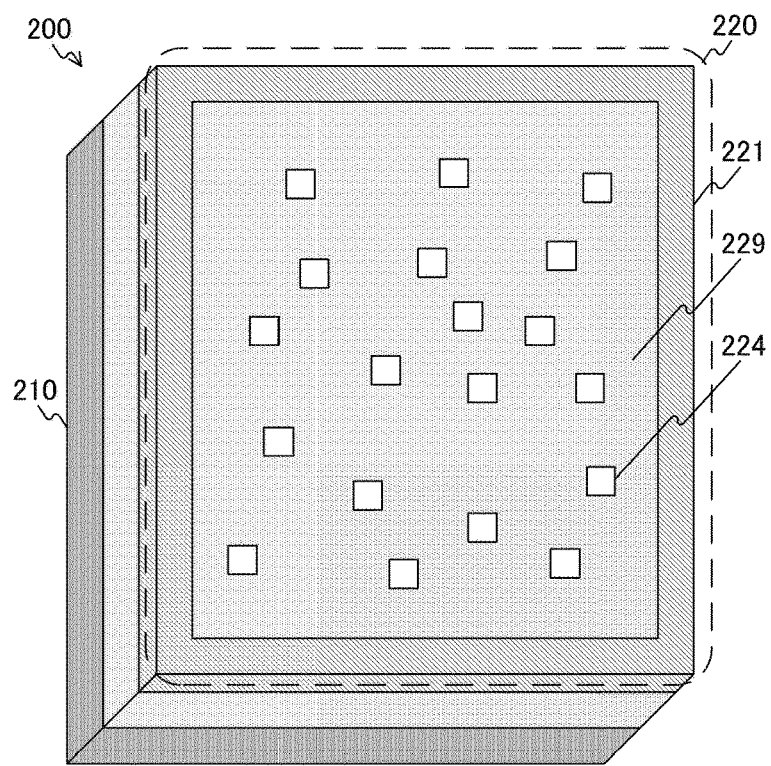

FIG. 2 is a diagram showing an example of the configuration of semiconductor chips in the first embodiment of the present technology. The drawing shows a configuration of the first semiconductor chip 100 and the second semiconductor chip 200 before being joined together. "a" in the drawing shows the configuration of a joining surface 120 (the surface indicated by the dotted line of "a" in the drawing) of the second semiconductor chip 200, and "b" in the drawing shows a joining surface 220 (the surface indicated by the dotted line of "b" in the drawing) of the second semiconductor chip 200. Both the semiconductor chips have a joining surface of a rectangular shape.

The first insulating layer 129, the first pads 124, and the first guard ring 121 are arranged on the joining surface 120.

The first pad 124 is arranged like an island embedded in the first insulating layer 129. Further, the first guard ring 121 is arranged in a shape bordering the joining surface 120.

The second insulating layer 229, the second pads 224, and the second guard ring 221 are arranged on the joining surface 220.

The second pad 224 is arranged like an island embedded in the second insulating layer 229. Further, the second pad 224 is arranged in a position symmetrical to the first pad 124. The second guard ring 221 is arranged in a shape bordering the joining surface 220.

The first joining surface 120 and the second joining surface 220 are joined together. In this event, the first pad 124 and the second pad 224 are joined together, the first insulating layer 129 and the second insulating layer 229 are joined together, and the first guard ring 121 and the second guard ring 221 are joined together. The joining method is described later.

The bonding strength between pieces of metal such as the first pad 124 and the second pad 224 is usually relatively high. On the other hand, the joining strength between the first insulating layer 129 and the second insulating layer 229, which account for a large part of the joining surface, is relatively low. In a case where activation treatment has been performed, the joining strength between the insulating layers can be improved, but problems like those described above arise. Thus, a desired joining strength can be obtained by arranging the first guard ring 121 and the second guard ring 221 on the joining surfaces and increasing the area of the joining portions of pieces of metal in the joining surfaces. Further, by arranging the first guard ring 121 and the second guard ring 221 in shapes bordering end portions of the joining surfaces 120 and 220, respectively, there is an effect of preventing the occurrence of a crack in an end portion of the joining surface. In the end portion of the joining surface, usually stress concentrates and therefore a crack is likely to occur. Thus, the occurrence of a crack can be prevented by arranging the guard ring 221 or the like in this portion to improve the joining strength.

[Width of Guard Ring]

Figure 3:
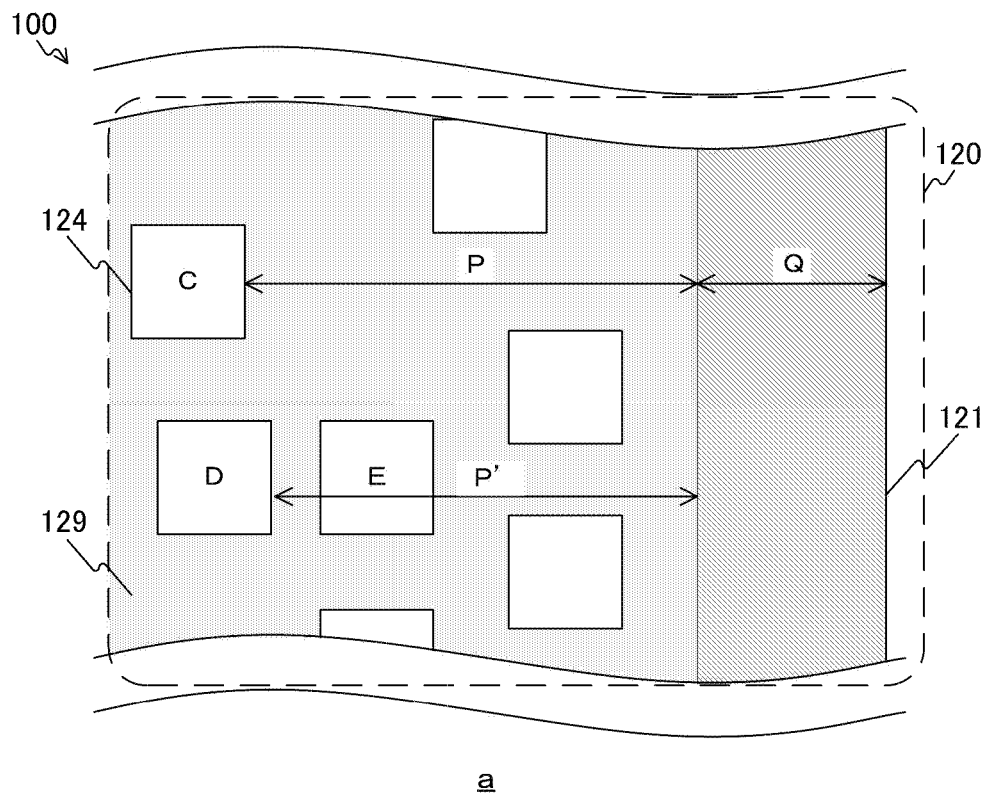
FIG. 3 is a diagram showing the width of a guard ring in the first embodiment of the present technology.
Figure 3:
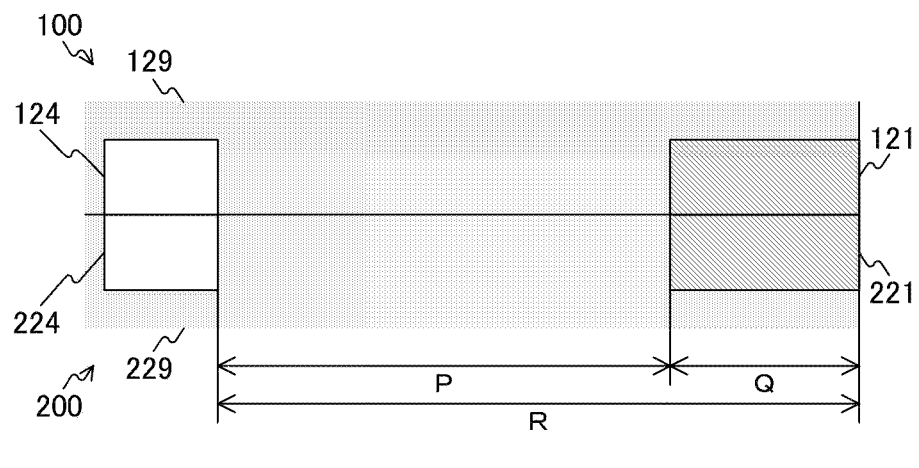

FIG. 3 is a diagram showing the width of a guard ring in the first embodiment of the present technology. The drawing shows a method for calculating the width of the first guard ring 121 and the second guard ring 221. "a" in the drawing shows a front view of an end portion of the first semiconductor chip 100, and "b" in the drawing shows a cross-sectional view of a joining portion of the semiconductor device 10.

As described above, the joining strength between insulating layers is lower than the joining strength between pieces of metal such as the first pad 124 and the second pad 224. The first pads 124 or the like are usually arranged in a region apart from a peripheral portion of the first semiconductor chip 100 or the like, where stress concentrates. Hence, the deficiency in joining strength can be compensated for by arranging the guard ring 121 or the like in the peripheral portion of the first semiconductor chip 100 or the like. Here, the width of the first guard ring 121 and the second guard ring 221 is denoted by Q. The Q may be calculated on the basis of the joining strength between the first insulating layer 129 and the second insulating layer 229 and the joining strength between the first guard ring 121 and the second guard ring 221 in an area extending from an end portion of the first semiconductor chip 100 to the first pad 124.

If the first pad 124 marked with "C" of "a" in the drawing is described as an example, Q may be calculated on the basis of the joining strength between the insulating layers and the joining strength between the guard rings in an area extending from an end portion of the first semiconductor chip 100 to the first pad 124. Here, the length of the joining portion of the insulating layers in this area is denoted by P. In order to obtain a desired joining strength in the first semiconductor chip 100 and the second semiconductor chip 200, it is necessary that the average joining strength of the joining strength of the insulating layer portion and the joining strength of the guard ring portion in the area mentioned above be made a value exceeding this desired joining strength. Here, the desired joining strength between the first semiconductor chip 100 and the second semiconductor chip 200 is a joining strength set in view of the reliability etc. required of the semiconductor device 10, and is a value expressed by the joining strength per unit area between these semiconductor chips.

If the desired joining strength is denoted by z, a relationship between z, and P and Q is the following formula.

$$x \times P + y \times Q)/R > z \quad \text{Formula 1}$$

Here, x represents the joining strength per unit area between the first insulating layer 129 and the second insulating layer 229. y represents the joining strength per unit area between the first guard ring and the second guard ring. R represents the length between the first pad 124 and an end portion of the first semiconductor chip 100. In addition, in the drawing, R is a length equal to the sum total of P and Q. The left side of Formula 1 expresses a mathematical operation in which the total value of the joining strength per unit length (the unit length in the vertical direction of "a" in the drawing) in the area mentioned above is divided by R to calculate the average value of the joining strength in the area.

As described in FIG. 2, the joining surface of the first semiconductor chip 100 and the second semiconductor chip 200 is in a rectangular shape; hence, the calculation of Q is performed for the four sides. In addition, values different between sides may be used as the value of Q. Further, the maximum value among the Qs calculated for all the sides may be used as a value of Q common to the four sides.

In addition, as shown in "a" in the drawing, the length of the joining portion of the first insulating layer 129 and the second insulating layer 229 on a path crossing an end portion of the first semiconductor chip 100 substantially perpendicularly may be used as P described above. Further, it is also possible to select a path on which the first pad 124 is not interposed. For example, for the first pad 124 marked with "D" of "a" in the drawing, the first pad 124 marked with "E" is interposed on a path leading to an end portion of the first semiconductor chip 100; thus, P' related to this path is excluded from the calculation of the joining strength. In such a case, the calculation of Q is performed using the first pad 124 marked with "E." Thereby, the calculation of Q can be performed more accurately.

Further, it is preferable to calculate Q on the basis of the longest path among the paths on which the first pad 124 described above is not interposed. The portion where the portion of P is longest falls under a portion where the joining portion of the insulating layers is longest. Thus, this is because Q is calculated with, as a reference, a portion where the joining strength is smallest, and this makes it possible to further improve the calculation accuracy of Q.

[Case where Shift or the Like During Alignment is Taken into Account]

Figure 4:
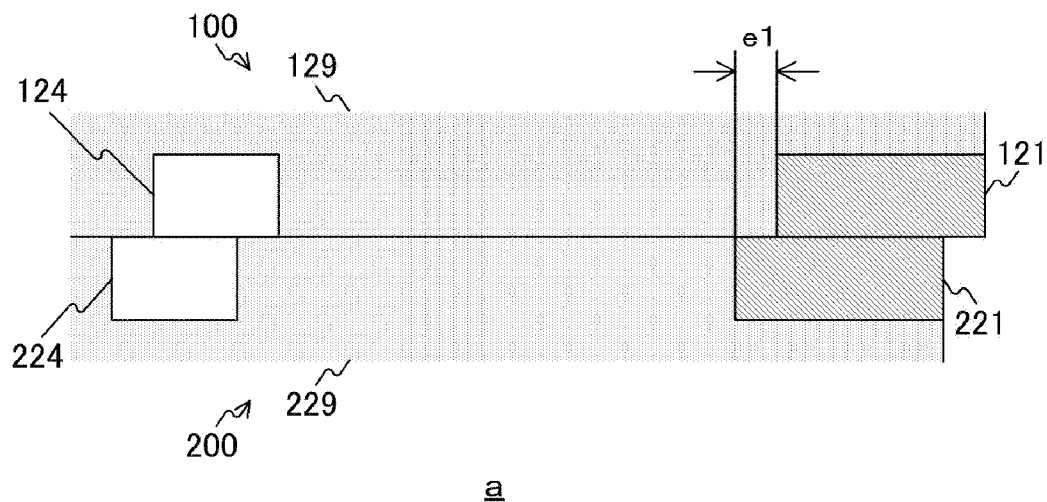
FIG. 4 is a diagram showing a shift or the like during alignment in the first embodiment of the present technology.
Figure 4:
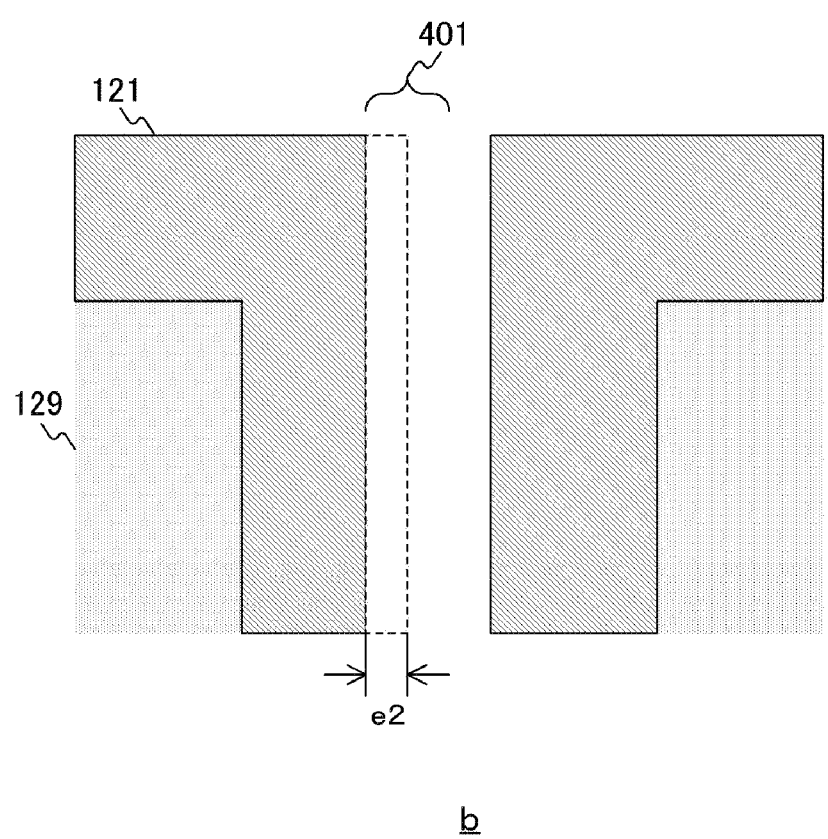

FIG. 4 is a diagram showing a shift or the like during alignment in the first embodiment of the present technology. "a" in the drawing shows an example of the case where an alignment shift e1 has occurred during the joining of the first semiconductor chip 100 and the second semiconductor chip 200. In such a case, the length of the joining portion of the first guard ring 121 and the second guard ring 221 is reduced. Hence, it is necessary to manufacture the first guard ring 121 and the second guard ring 221 after adding e1 to Q.

Further, "b" in the drawing shows an example of the case where a shift e2 of dicing on the occasion of cutting out the semiconductor device 10 from a wafer has occurred. Here, 401 of "b" in the drawing shows the dicing position. Also in such a case, it is necessary to add e2 to Q in order to prevent the reduction in the area of the joining portion of the first guard ring 121 and the second guard ring 221.

[Method for Manufacturing Semiconductor Device]

The semiconductor device 10 can be manufactured by the following procedure. The first semiconductor chip 100 and the second semiconductor chip 200 including the first guard ring 121 and the second guard ring 221 with a width of Q calculated in the above manner are manufactured. These chips can be manufactured by a common method for manufacturing a semiconductor chip. Further, the first guard ring 121 and the second guard ring 221 can be manufactured by the same manufacturing method as the first pad 124 and the second pad 224. Next, the first joining surface 120 of the first semiconductor chip 100 and the joining surface 220 of the second semiconductor chip 200 are polished to make these joining surfaces smooth. The chemical mechanical polishing (CMP) method may be used for the polishing. Next, the alignment of the first semiconductor chip 100 and the second semiconductor chip 200 is performed to perform the sticking of the joining surfaces. Heating is performed in the stuck state to a temperature of 300 to 600° C., and thus both chips are joined together. Thereby, the semiconductor device 10 can be manufactured.

Thus, in the first embodiment of the present technology, the joining surfaces of the semiconductor chips are provided with the first guard ring 121 and the second guard ring 221. As these guard rings, a guard ring with a width calculated on the basis of the strength of the joining portion of the insulating layers and the strength of the joining portion of the guard rings in an area extending from an end portion of the first semiconductor chip 100 to the first pad 124 is used. Thereby, the joining strength of the semiconductor device 10 can be made a desired joining strength.

First Modification Example

In the embodiment described above, the first guard ring 121 and the second guard ring 221 are configured to have the same width. In contrast, the widths of the first guard ring 121 and the second guard ring 221 may be set to different values. This is in order to absorb errors during manufacturing such as alignment shifts.

Figure 5:
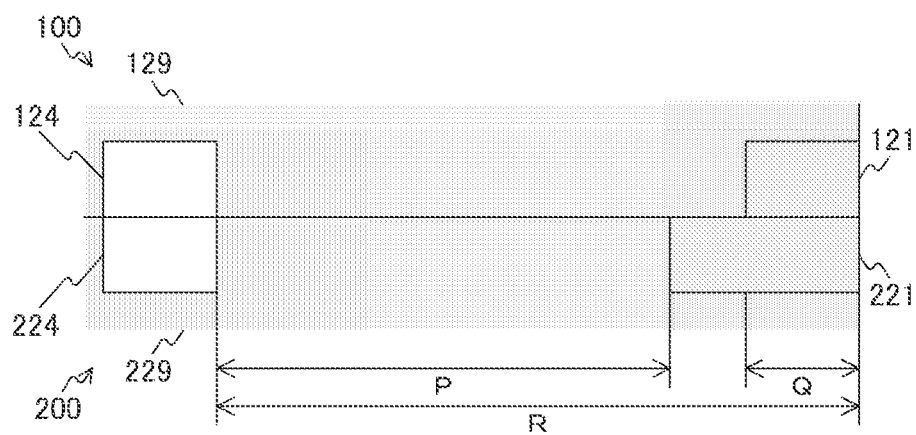
FIG. 5 is a diagram showing the widths of guard rings in a modification example of the first embodiment of the present technology.

FIG. 5 is a diagram showing the widths of guard rings in a modification example of the first embodiment of the present technology. The drawing is a diagram showing an example of the case where the widths of the first guard ring 121 and the second guard ring 221 are different. Also in this case, a desired joining strength can be obtained by setting the length of the joining portion of the first guard ring 121 and the second guard ring 221 to a value equal to Q.

2. Second Embodiment

In the embodiment described above, one guard ring is used for each of the semiconductor chips. In contrast, in a second embodiment of the present technology, a guard ring is divided and a plurality of guard rings are used. Thereby, the occurrence of a defect during CMP polishing is prevented.

[Configuration of Guard Ring]

Figure 6:
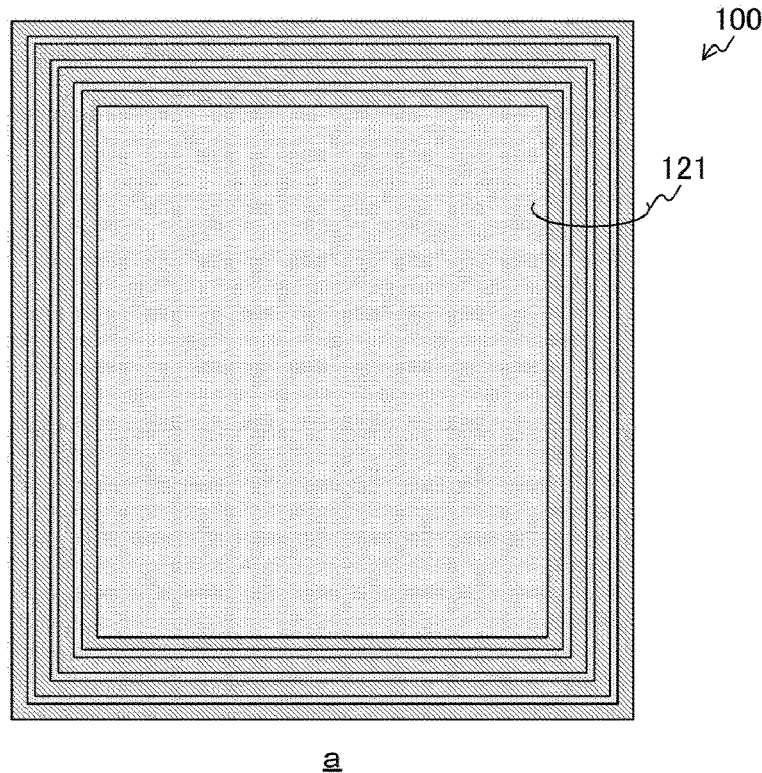
FIG. 6 is a diagram showing guard rings in a second embodiment of the present technology.
Figure 6:
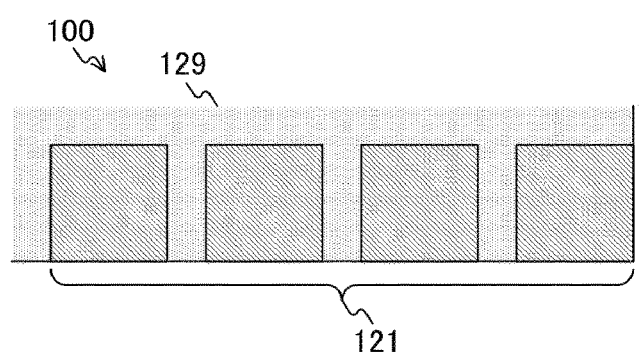
Figure 6:
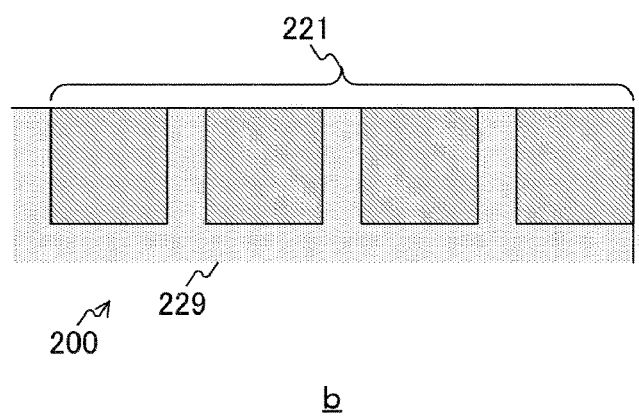

FIG. 6 is a diagram showing guard rings in the second embodiment of the present technology. As described above, the polishing of the joining surface of the semiconductor chip by the CMP method is performed in the manufacturing process of the semiconductor device 10. In this event, if the width Q of the first guard ring 121 and the second guard ring 221 is too large, there is a case where what is called dishing in which the guard ring portion is excessively cut off occurs. To prevent this, as shown in the drawing, the first guard ring 121 and the second guard ring 221 are divided and arranged. The drawing shows an example in which each guard ring is divided into four pieces. In this event, the sum total of the widths of the divided guard rings is set equal to Q. Otherwise, the configuration of the semiconductor device 10 is similar to the semiconductor device 10 described in FIG. 1, and therefore a description is omitted.

Thus, in the second embodiment of the present technology, by dividing a guard ring, the occurrence of dishing during CMP polishing can be prevented while a desired joining strength is kept.

3. Third Embodiment

In the embodiments described above, Q is calculated on the basis of the strength of the joining portion of the insulating layers in an area extending from an end portion of the first semiconductor chip 100 to the first pad 124 and other factors. In contrast, in a third embodiment of the present technology, a dummy pad is added to the joining surface to use an area from an end portion of the first semiconductor chip 100 to the first pad 124 or the dummy pad, and Q is calculated. Thereby, Q can be reduced while the joining strength is kept.

[Configuration of Semiconductor Device]

Figure 7:
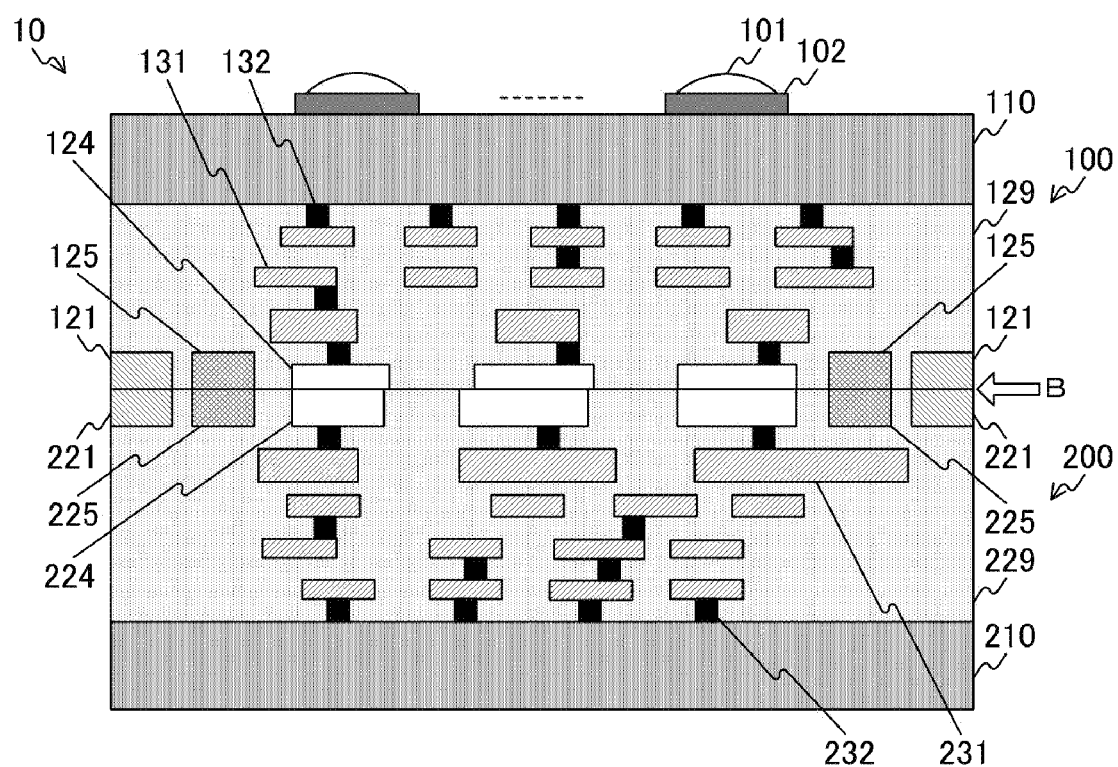
FIG. 7 is a diagram showing an example of the configuration of the semiconductor device 10 in a third embodiment of the present technology.

FIG. 7 is a diagram showing an example of the configuration of the semiconductor device 10 in the third embodiment of the present technology. The semiconductor device 10 of the drawing differs from the semiconductor device 10 described in FIG. 1 in that a first dummy pad 125 and a second dummy pad 225 are arranged in the first semiconductor chip 100 and the second semiconductor chip 200, respectively.

[Configuration of Dummy Pad]

Figure 8:
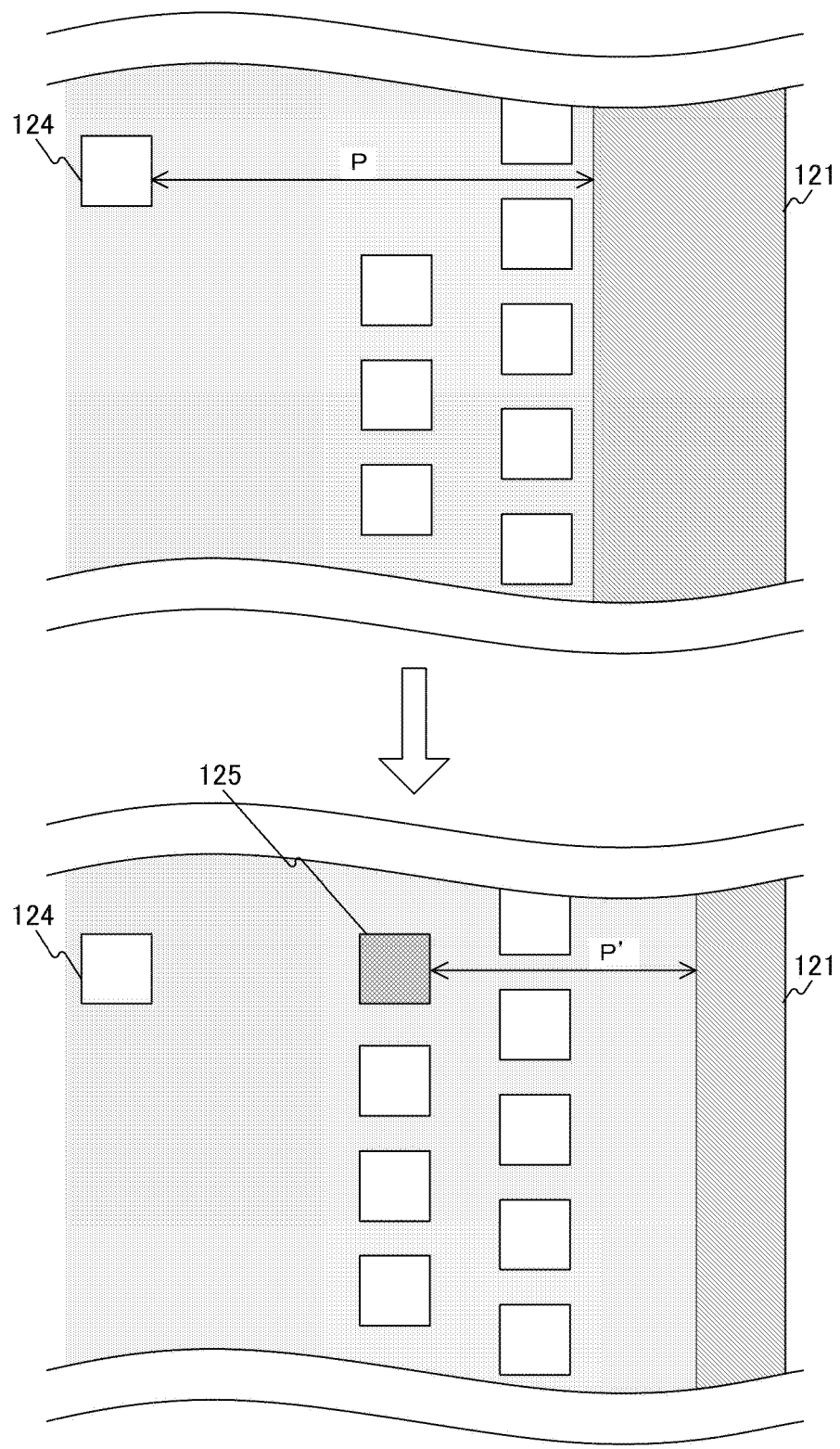
FIG. 8 is a diagram showing a dummy pad in the third embodiment of the present technology.

FIG. 8 is a diagram showing a dummy pad in the third embodiment of the present technology. In the first embodiment of the present technology, Q is calculated on the basis of the joining strength between pieces of insulator in an area from an end portion of the first semiconductor chip 100 to the first pad 124 and other factors. However, as shown in the figure on the upper side in the drawing, the value of Q is large in a case where the distance between the first pad 124 and the end portion of the first semiconductor chip 100 is large. Hence, a case where the first guard ring 121 comes close to another first pad and the design rule is violated occurs. Thus, as shown in the figure on the lower side in the drawing, a first dummy pad 125 is arranged between the first pad 124 and the end portion of the first semiconductor chip 100. The first dummy pad 125 is arranged on the joining surface 120, but is not connected to the interconnection layer 131 or the via 132, and is an electrically independent pad.

In addition, a dummy pad 225 is arranged in a position facing the first dummy pad 125 on the joining surface 220. Further, Q is calculated on the basis of the joining strength between the insulating layers and the joining strength between the guard rings in an area extending from an end portion of the first semiconductor chip 100 and first reaching the first pad 124 or the first dummy pad 125. By adding the first dummy pad 125 and the second dummy pad 225, P can be shortened and also Q based on this can be shortened. Thereby, the violation of the design rule can be avoided. Otherwise, the configuration of the semiconductor device 10 is similar to the semiconductor device 10 described in FIG. 1, and therefore a description is omitted.

[Design Procedure of Guard Ring]

Figure 9:
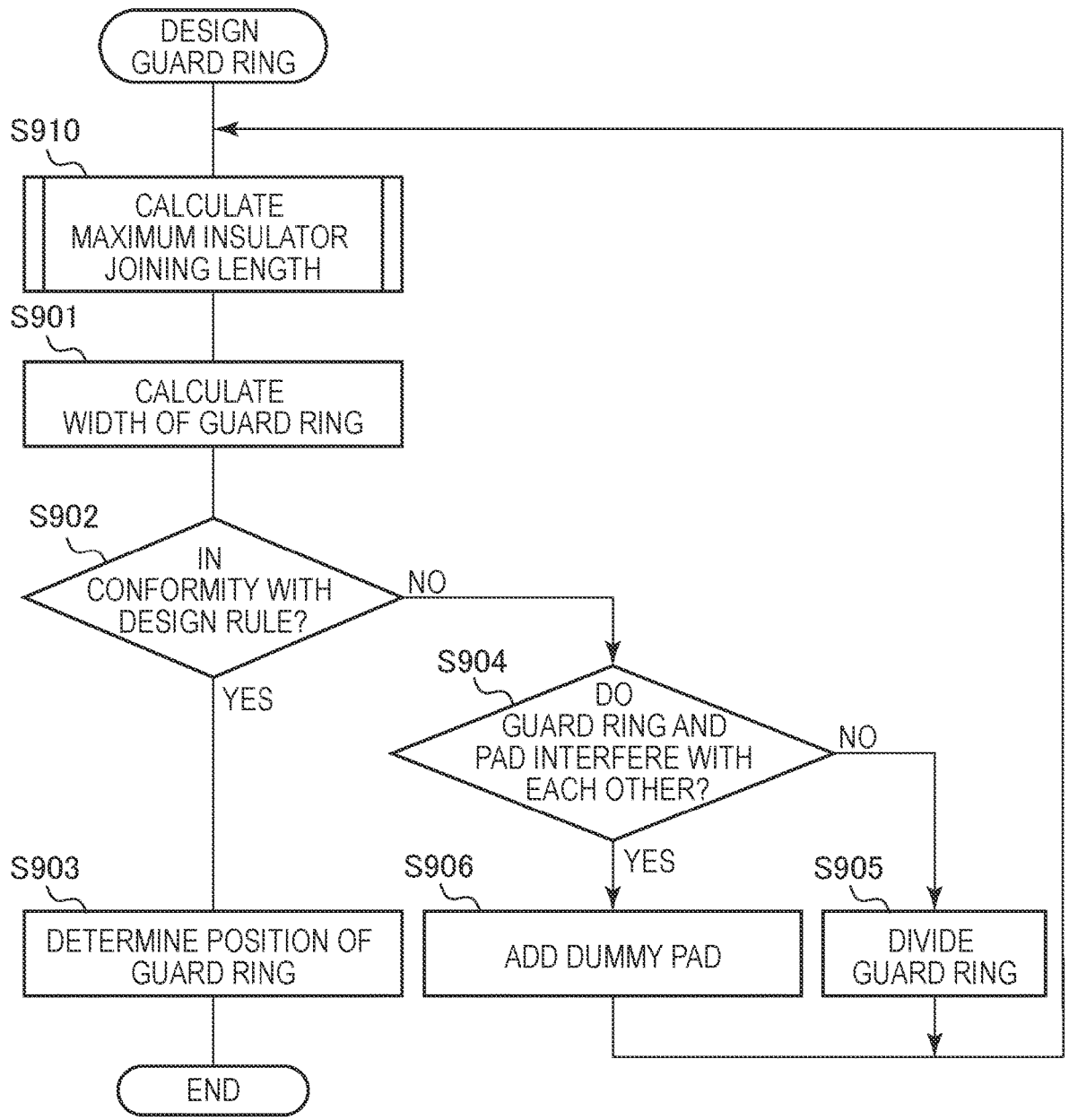
FIG. 9 is a diagram showing a design procedure of a guard ring in an embodiment of the present technology.

FIG. 9 is a diagram showing a design procedure of a guard ring in an embodiment of the present technology. The drawing shows a design procedure of a guard ring including a procedure of the addition of a dummy pad and the division of a guard ring. First, the maximum insulator joining length is calculated (step S910). Here, the maximum insulator joining length is the maximum value of P. Next, the width of the guard ring is calculated on the basis of the maximum insulator joining length (step S901). This can be calculated by Formula 1 described above. Next, whether the width of the guard ring is in conformity with a design rule or not is assessed (step S902). Here, a rule related to the use of the CMP method is included in the design rule. As a result, in a case of being in conformity with the design rule (step S902: Yes), the position of the guard ring is determined (step S903), and the design of the guard ring is finished.

On the other hand, in a case of not being in conformity with the design rule (step S902: No), whether the guard ring and the pad interfere with each other or not is assessed (step S904). That is, whether the distance between the guard ring and the pad is appropriate or not is assessed. As a result, in a case where the guard ring and the pad interfere with each other (step S904: Yes), a dummy pad is added (step S906), and the procedure from step S910 is executed again. On the other hand, in a case where the guard ring and the pad do not interfere with each other (step S904: No), the guard ring is divided (step S905), and the procedure from step S910 is executed again.

Figure 10:
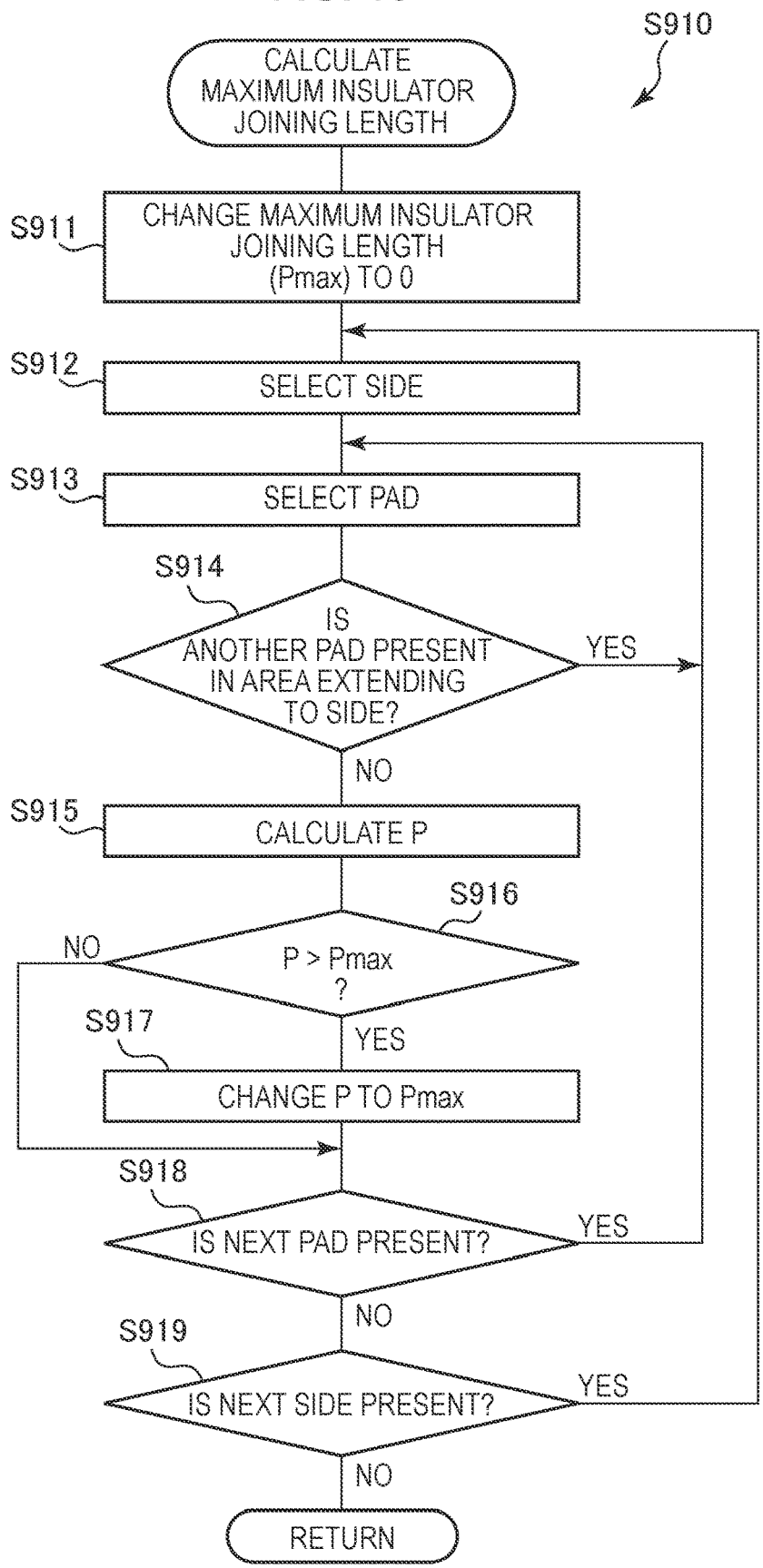
FIG. 10 is a diagram showing a maximum insulator joining length calculation procedure in an embodiment of the present technology (step S910).

FIG. 10 is a diagram showing a maximum insulator joining length calculation procedure in an embodiment of the present technology (step S910). First, the maximum insulator joining length (Pmax) is initialized to the value "0" (step S911). Next, a side of the semiconductor chip is selected (step S912), and a pad is selected (step S913). Whether another pad is present between the selected pad and the selected side or not is assessed (step S914); in a case where another pad is present (step S914: Yes), the procedure returns to step S913 again, and another pad is selected. On the other hand, in a case where there is no other pad (step S914: No), P described in FIG. 3 is calculated (step S915). The calculated P and Pmax are compared; in a case where P is larger than Pmax (step S916: Yes), Pmax is changed to P (step S917), and the procedure goes to the procedure of step S918. On the other hand, in a case where P is Pmax or less (step S916: No), the procedure of step S917 is skipped, and the procedure goes to the procedure of step S918.

In step S918, whether the next pad is present or not is assessed (step S918). That is, whether the calculation of P has been performed for all the pads or not is assessed. In a case where the next pad is present (step S918: Yes), the procedure from step S913 is executed again. On the other hand, in a case where the next pad is absent (step S918: No), whether the next side is present or not is assessed (step S919). That is, whether the calculation of Pmax has been performed for all the sides or not is assessed. As a result, in a case where the next side is present, the procedure from step S912 is executed again. On the other hand, in a case where the next side is absent, the maximum insulator joining length calculation procedure is finished.

Thus, in the third embodiment of the present technology, by adding a dummy pad, the violation of the design rule can be avoided while a desired joining strength is kept.

As described above, in an embodiment of the present technology, a guard ring with a width calculated on the basis of the strength of the joining portion of insulating layers and the strength of the joining portion of guard rings in an area from an end portion of a semiconductor chip to a pad is arranged on the joining surface and used. Thereby, the joining strength of the semiconductor device can be made a desired joining strength without performing activation treatment of the joining surface.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

The processing sequences that are described in the embodiments described above may be handled as a method having a series of sequences or may be handled as a program for causing a computer to execute the series of sequences and recording medium storing the program. As the recording medium, a hard disk, a CD (Compact Disc), an MD (Mini-Disc), and a DVD (Digital Versatile Disk), a memory card, and a Blu-ray disc (registered trademark) can be used.

In addition, the effects described in the present specification are not limiting but are merely examples, and there may be other effects.

Additionally, the present technology may also be configured as below.

(1)

A semiconductor device including:
  a first semiconductor chip including a first joining surface including
    a first insulating layer,
    a plurality of first pads to which a first inner layer circuit insulated by the first insulating layer is electrically connected, and
    a linear first metal layer arranged on an outside of the plurality of first pads; and a second semiconductor chip including a second joining surface joined to the first joining surface, the second joining surface including
a second insulating layer,
a plurality of second pads that are arranged in positions facing the first pads and to which a second inner layer circuit insulated by the second insulating layer is electrically connected, and
a linear second metal layer arranged in a position facing the first metal layer,
in which a width of the first metal layer and the second metal layer is a width based on a joining strength between the first insulating layer and the second insulating layer and a joining strength between the first metal layer and the second metal layer in an area from an end portion of the first semiconductor chip to the first pad.

(2)
The semiconductor device according to (1),
in which the width of the first metal layer and the second metal layer is a width based on an average value of a joining strength between the first insulating layer and the second insulating layer and a joining strength between the first metal layer and the second metal layer in the area.

(3)
The semiconductor device according to (2),
in which the width of the first metal layer and the second metal layer is substantially equal to a width Q satisfying the following relation, $(x \times P + y \times Q)/R > z$ where
z: a joining strength per unit area between the first semiconductor chip and the second semiconductor chip,
x: a joining strength per unit area between the first insulating layer and the second insulating layer,
y: a joining strength per unit area between the first metal layer and the second metal layer,
P: a length of a joining portion of the first insulating layer and the second insulating layer on a path crossing an end portion of the first semiconductor chip substantially perpendicularly, and
R: a length between the first pad and the end portion of the first semiconductor chip on the path.

(4)
The semiconductor device according to (3),
in which the path is a path crossing the end portion of the first semiconductor chip substantially perpendicularly, and extending from the end portion of the first semiconductor chip and first reaching the first pad.

(5)
The semiconductor device according to (4),
in which the path is a path with the longest distance among paths crossing the end portion of the first semiconductor chip substantially perpendicularly, and extending from the end portion of the first semiconductor chip and first reaching the first pad.

(6)
The semiconductor device according to any of (1) to (5),
in which the first joining surface further includes a first dummy pad to which the first inner layer circuit is not electrically connected,
the second joining surface further includes a second dummy pad that is arranged in a position facing the first dummy pad and to which the second interior circuit is not electrically connected, and
the width of the first metal layer and the second metal layer is a width based on a joining strength between the first insulating layer and the second insulating layer and a joining strength between the first metal layer and the second metal layer in an area extending from an end portion of the first semiconductor chip and first reaching the first pad or the first dummy pad.

(7)
The semiconductor device according to any of (1) to (6),
in which the first metal layer and the second metal layer are divided into a prescribed number of pieces.

(8)
The semiconductor device according to any of (1) to (7),
in which the first semiconductor chip and the second semiconductor chip are configured in a rectangular shape, and
the width of the first metal layer and the second metal layer is a width based on a joining strength between the first insulating layer and the second insulating layer and a joining strength between the first metal layer and the second metal layer in the area for each side of each of the first semiconductor chip and the second semiconductor chip.

(9)
An imaging device including:
a first semiconductor chip including
a first joining surface including
a first insulating layer,
a plurality of first pads to which a first inner layer circuit insulated by the first insulating layer is electrically connected, and
a linear first metal layer arranged on an outside of the plurality of first pads, and
a first diffusion layer including
a semiconductor region to which the first inner layer circuit is electrically connected and that convers applied light to an electrical signal; and
a second semiconductor chip joined to the first joining surface, the second semiconductor chip including
a second joining surface including
a second insulating layer,
a plurality of second pads that are arranged in positions facing the first pads and to which a second inner layer circuit insulated by the second insulating layer is electrically connected, and
a linear second metal layer arranged in a position facing the first metal layer, and a second diffusion layer including
a semiconductor region to which the second inner layer circuit is electrically connected and that processes the electrical signal,
in which a width of the first metal layer and the second metal layer is a width based on a joining strength between the first insulating layer and the second insulating layer and a joining strength between the first metal layer and the second metal layer in an area extending from an end portion of the first semiconductor chip to the first pad.

REFERENCE SIGNS LIST

10 semiconductor device
100 first semiconductor chip
101 microlens
102 color filter 110 first diffusion layer
120 first joining surface
121 first guard ring
124 first pad
125 first dummy pad
129 first insulating layer
131, 231 interconnection layer
132, 232 via
200 second semiconductor chip
210 second diffusion layer
220 second joining surface
221 second guard ring
224 second pad
225 second dummy pad
229 second insulating layer

The invention claimed is:

1. A light detecting device, comprising:
a first substrate including a plurality of pixels in a pixel array and a first wiring layer, wherein the first wiring layer includes a first electrode and a second electrode; and
a second substrate including a signal processing region and a second wiring layer,
wherein the plurality of pixels outputs a plurality of pixel signals to the signal processing region,
wherein the second wiring layer includes a third electrode and a fourth electrode,
wherein the first electrode is bonded to the third electrode,
wherein the first electrode and the third electrode are electrically connected to each other,
wherein the first electrode is electrically connected to the first substrate,
wherein the third electrode is electrically connected to the second substrate,
wherein the second electrode and the fourth electrode are disposed outside of the pixel array,
wherein the second electrode is bonded to the fourth electrode,
wherein the second electrode and the fourth electrode are electrically connected to a potential that is different from the plurality of pixel signals,
wherein the second electrode and the fourth electrode each includes a plurality of cascading portions provided around perimeters of respective first and second wiring layers, and
wherein one of the cascading portions of each of the plurality of cascading portions provided around perimeters of the respective first and second wiring layers borders end portions of the respective first and second wiring layers.

2. The light detecting device of claim 1, wherein the first substrate further includes a first via.

3. The light detecting device of claim 2, wherein the first via is electrically connected to the second electrode.

4. The light detecting device of claim 3, wherein the second electrode is electrically connected to a grounding conductor.

5. The light detecting device of claim 1, wherein the first substrate is mechanically bonded to the second substrate.

6. The light detecting device of claim 1, wherein the signal processing region is configured to perform processing of the pixel signals.

7. The light detecting device of claim 6, wherein the processing includes analog to digital conversion of the pixel signals.

8. The light detecting device of claim 6, wherein the signal processing region is configured to generate control signals for the pixels.

9. The light detecting device of claim 1, wherein the second electrode is a linear metal layer arranged on an outside of the first electrode.

10. The light detecting device of claim 9, wherein the fourth electrode is a linear metal layer arranged on an outside of the third electrode.

11. The light detecting device of claim 10, wherein the second electrode, the first electrode, the fourth electrode, and the third electrode are formed from copper.

12. The light detecting device of claim 1, wherein the first substrate further includes a first insulating layer, wherein the second electrode, the first electrode, and the first insulating layer form portions of a bonding surface of the first substrate.

13. The light detecting device of claim 12, wherein the second substrate further includes a second insulating layer, wherein the fourth electrode, the third electrode, and the second insulating layer form portions of a bonding surface of the second substrate.

14. The light detecting device of claim 13, wherein the bonding surface of the first substrate and the bonding surface of the second substrate are bonded together.

15. The light detecting device of claim 14, wherein the first electrode is embedded in the first insulating layer, and wherein the third electrode is embedded in the second insulating layer.

16. The light detecting device of claim 15, wherein at least a portion of the first insulating layer between the first electrode and the second electrode and at least a portion of the second insulating layer between the third electrode and the fourth electrode are bonded together.

17. The light detecting device of claim 1, wherein the second electrode and the fourth electrode have a same width.

18. The light detecting device of claim 1, wherein the first substrate includes a plurality of wiring layers.

19. The light detecting device of claim 18, wherein a plurality of vias and the plurality of wiring layers connect the pixels to the processing region.

20. An imaging device, comprising:
a light detecting device, including:
a first substrate including a plurality of pixels in a pixel array and a first wiring layer, wherein the first wiring layer includes a first electrode and a second electrode;
a second substrate including a signal processing region and a second wiring layer,
wherein the plurality of pixels outputs a plurality of pixel signals to the signal processing region,
wherein the second wiring layer includes a third electrode and a fourth electrode,
wherein the first electrode is bonded to the third electrode,
wherein the first electrode and the third electrode are electrically connected to each other,
wherein the first electrode is electrically connected to the first substrate,
wherein the third electrode is electrically connected to the second substrate,
wherein the second electrode and the fourth electrode are disposed outside of the pixel array,
wherein the second electrode is bonded to the fourth electrode,
wherein the second electrode and the fourth electrode are electrically connected to a potential that is different from the plurality of pixel signals, wherein the second electrode and the fourth electrode each includes a plurality of cascading portions provided around perimeters of respective first and second wiring layers, and wherein one of the cascading portions of each of the plurality of cascading portions provided around perimeters of the respective first and second wiring layers borders end portions of the respective first and second wiring layers;

a plurality of microlenses, wherein at least one microlens is provided for each pixel in the plurality of pixels; and a plurality of color filters, wherein the color filters are between the microlenses and the pixels.

* * * * *